United States Patent [19]
Pharr

[11] Patent Number: 5,926,015
[45] Date of Patent: Jul. 20, 1999

[54] MACHINE READABLE DISPLAY UNIT

[76] Inventor: Robert S. Pharr, 1930 12th St. La. N.E., Hickory, N.C. 28601

[21] Appl. No.: 08/279,565

[22] Filed: Jul. 25, 1994

[51] Int. Cl.$^6$ ....................................................... G01R 1/00
[52] U.S. Cl. ............................ 324/114; 324/142; 324/110
[58] Field of Search ....................... 340/870.02; 324/114, 324/110, 142

[56] References Cited

U.S. PATENT DOCUMENTS

| | | |
|---|---|---|
| 4,588,949 | 5/1986 | Becker et al. ........................... 324/110 |
| 4,803,484 | 2/1989 | Schutman et al. .................. 340/870.02 |
| 4,977,368 | 12/1990 | Munday et al. . |
| 5,115,190 | 5/1992 | Varney, Jr. . |
| 5,184,064 | 2/1993 | Vicknair et al. . |
| 5,278,551 | 1/1994 | Wakatsuki et al. . |

OTHER PUBLICATIONS

Roger C. Palmer, The Bar Code Book, 2nd Edition, 1991 (month unavailable), Helmers Publishing, Inc. (Cover, title page, table of contents, and pp. 31–33 are enclosed herewith; entire book is available upon request).

*Primary Examiner*—Josie Ballato
*Assistant Examiner*—Russell M. Kobert

[57] ABSTRACT

A machine readable unit for meter devices of the type presenting a changeable, readable indicia proportional to a changeable input thereto, to include electric rate meters, gas meters, water meters, and other data registers, includes an assembly for displaying alphanumeric indicia in a machine readable format and an assembly for changing the displayed indicia responsive to input to the meter device.

25 Claims, 7 Drawing Sheets

MACHINE READABLE DISPLAY UNIT

BACKGROUND OF THE INVENTION

The present invention relates broadly to registers or displays of accumulated data and, more particularly, to a machine readable display unit for displaying accumulated data in a machine readable format with particular applicability to electric rate meters or other consumption meters.

Electric utility rate meters, gas meters or other devices for displaying an on-going amount of energy consumption typically use alphanumeric indicia to display a number or other symbol, commensurate with energy consumed during a predetermined time period. The meter functions as a register and includes apparatus for changing the display responsive to energy use. The process is on-going and the number is constantly changing so long as energy is being consumed. In order for the utility company to determine energy usage per household, a person known generally as a "meter reader" is typically employed. This person travels the neighborhoods and visually inspects each meter, recording the displayed number. By subtracting a currently displayed number from the last recorded number, energy usage in the interim can be determined. Problems arise, however, if the meter reader transposes numbers or otherwise records an inaccurate reading from the meter display. This problem exists, not only for electric meters, but other rate meters, both gas and water, and on any instrumentation wherein displayed values are recorded by humans, such as instrumentation associated with power generation plants.

Machine readable codes have been around for several years. The most common machine readable code is a bar code. Widely implemented in the marketplace, bar codes are rapidly gaining increasing visibility in a broad range of diverse applications. A bar code symbol consists of a series of parallel, adjacent bars and spaces. Predetermined width patterns are used to represent actual data in the symbol. To read the information contained in a bar code symbol, a scanning device such as a light pen or other hand-held scanning device is moved across the symbol from one side to the other. As the scanning device is moved across the symbol, the width pattern of the bars and spaces is analyzed by the reading equipment and the original data is recovered. Some scanning devices do not require the operator to provide the scanning motion but include moving optical elements which allow the symbols, bars and spaces to be sequentially examined automatically. Currently, hand-held bar code scanners are available which can be communicated with a central computer to record and process data. Further, such hand-held scanners may include a transceiver which eliminates any wire connection between the scanning unit and a base station.

Bar codes are currently used in one aspect of rate meter reading. U.S. Pat. No. 5,278,551 to Wakatsuki et al discloses a system wherein a meter at each user's house has a user number displayed in bar code symbology thereon and a separate display section for displaying a reading. A data input terminal includes a bar code reader for reading the user number and a keyboard for manually inputting the present reading. With the Wakatsuki et al device, the meter reader must scan the identification code and then manually input the data reading from the meter display. Whether the meter reader is using paper and pen to record the data or a keyboard, the possibility of inaccurate readings remains.

SUMMARY OF THE INVENTION

It is accordingly an object of the present invention to provide a machine readable display unit for meter devices which eliminates the human error associated with reading and recording the display.

More particularly, it is an object of the present invention to provide a machine readable display unit for metered devices of the type presenting a changeable, readable indicia proportional to a changeable input thereto. The machine readable display unit includes an assembly for displaying alphanumeric indicia in a machine readable format and an assembly for changing the displayed indicia responsive to the input to the meter device. Preferably, the display assembly includes an assembly for displaying alphanumeric indicia in a bar code format which is readable and recordable by a bar code reading and recording device. It is further preferred that the display assembly displays individual alphanumeric characters and the changing assembly includes an arrangement for changing each individual character responsive to input to the meter device.

The display assembly of the present invention may include an assembly for displaying alphanumeric indicia in both a human readable format and a machine readable format. Preferably, the human readable indicia is superimposed over the machine readable indicia.

It is further preferred that the machine readable indicia is formed as a machine readable code including dark portions and light portions arranged in a predetermined pattern and the human readable indicia is formed with the dark portions in a contrasting shade to display the indicia in a human readable form with the dark portions remaining machine readable.

Preferably, the display assembly includes a plurality of rotatably driven tumblers in generally axial alignment, the rotatable tumblers carrying the individual characters sequentially about the outer surface thereof for sequentially displaying the individual characters and the changing assembly includes an assembly for rotatably driving the tumblers at a rate proportional to the input to the meter device.

Alternately, the display assembly may include an electronic arrangement for displaying the characters in a machine readable format. Preferably, the electronic display arrangement includes a liquid crystal diode.

It is further preferred that the display assembly is configured for use with an electric utility rate meter. Alternately, the display unit may include an assembly for mounting an operating display unit in a preexisting meter device for replacement of the alphanumeric display within the preexisting meter device. The display unit then preferably includes a housing and an input assembly for applying an input to the changing assembly proportional to the input to the meter device.

By the above, the present invention provides a display unit which displays data which may constantly change in a machine readable format. The present invention is particularly useful with rate meters, including electric meters, gas meters or water meters, but may be useable in a broader range of applications. Further, the machine readable format may be a bar code or other machine readable code for recording by an electronic bar code reading and recording device. The present invention therefore removes human error from reading and recording displayed data on a meter.

DETAILED DESCRIPTION OF THE PREFERRED EMBODIMENT

Figure 1:
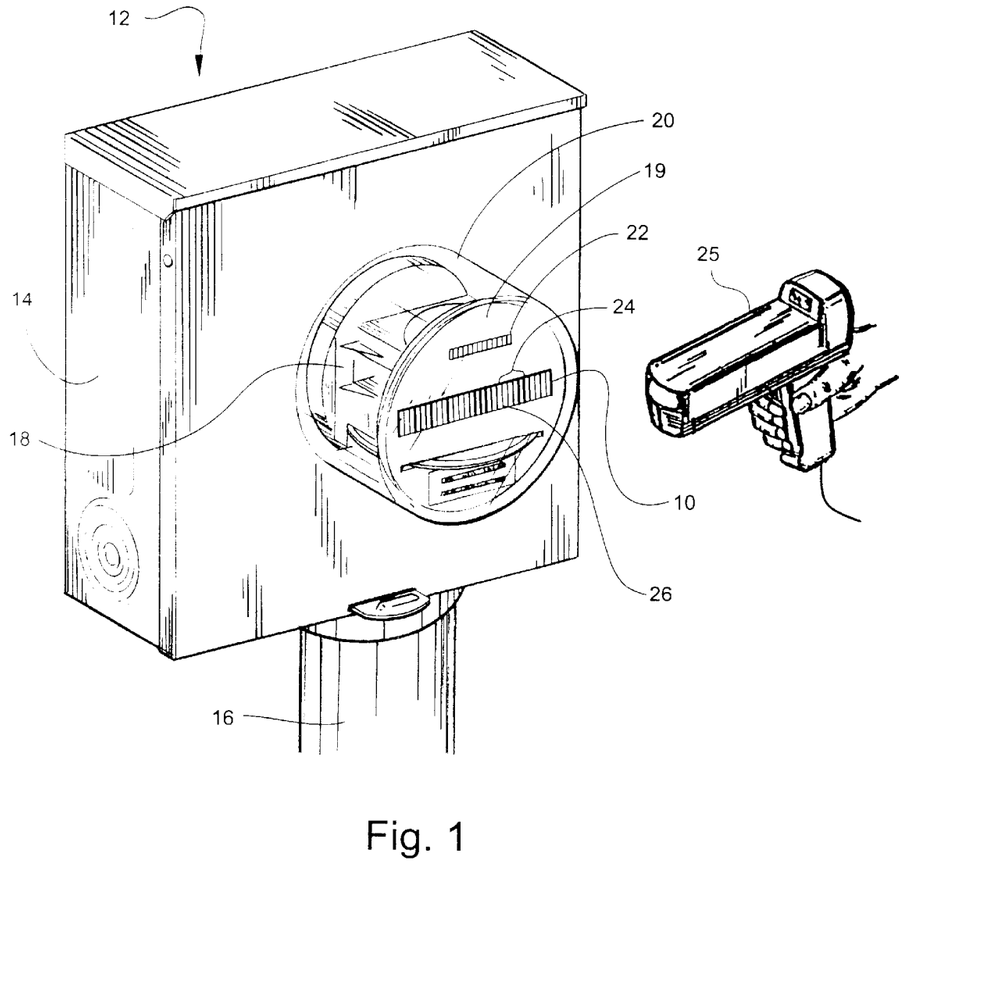
FIG. 1 is a perspective view of an electric utility rate meter including a machine readable display unit according to the preferred embodiment of the present invention.

Turning now to the drawings and, more particularly, to FIG. 1, an electric meter including the machine readable display unit of the present invention is pictured generally at 12. The electric meter 12 is an otherwise conventional electric meter including a generally rectangular housing 14 having an electrical conduit 16 projecting downwardly therefrom for internal wiring. A generally cylindrical glass dome 20 projects outwardly from one face of the meter housing 14 and covers the internal meter components 18. According to the present invention, a machine readable display 10 is visible through the dome 18 and is accessible for scanning by a hand-held scanner 25. Optionally, a non-changing identification code 22 may be affixed to the front face 19 of the meter 12.

The machine readable code is preferably in the form of a bar code but it should be understood that the present invention contemplates the use of other machine readable codes capable of representing single digits in a changeable format. The preferred code for the present invention is, however, the bar code due to the availability of scanning and recording equipment. It is also contemplated that conventional scanners and recording equipment may be used with the present invention with proper preprogramming.

There are several forms of bar codes available for use which have been developed over the years, some for a specific application. Bar codes are interpreted by light reflection and the codes consist of a predetermined arrangement of narrow bars, wide bars, narrow white spaces, and wide white spaces. The preferred bar code symbology is known to those skilled in the art as Code 39. However, most people are familiar with the Universal Product Code (UPC) which is configured to uniquely identify a product and its manufacturer. UPC is a fixed length, numeric, continuous symbology employing four element widths. UPC symbology includes a plurality of guard bars at either end of the code which are of greater height than the alphanumeric representation bars in order to maximize the allowable scanning tilt angle. The preferred code of the present invention differs somewhat from the familiar UPC code. Code 39 was the first alphanumeric symbology to be developed. Widely used, it is now the de facto non-retail symbology. It is a discrete, self-checking, variable length symbology that can be readily printed by a variety of technologies.

Two key elements of Code 39 make it preferable for use with the present invention. Every Code 39 character has five bars and four spaces, making a total of nine elements. Of these nine elements, three are wide and six are narrow, making Code 39 a two-width code. The uniformity of character size makes Code 39 characters especially suited for representing individual, sequential digits for use on tumblers, which will be explained in greater detail presently. Further, each Code 39 symbol begins and ends with an asterisk, which is the symbology start/stop code. These asterisks can be permanently affixed to either side of the changing display. Additionally, each character is separated from its neighbor by a loosely toleranced intercharacter gap that contains no information. This intercharacter gap allows for the individual representation of numerals on each tumbler with a space therebetween. Accordingly, no special consideration need be given to providing a changing mechanism which provides no spacing between digits. With reference to FIG. 1, the Code 39 symbol for the numeral "7" is indicated at 24. Although not required, for uniformity, it is preferred that the identification Code 22 affixed to the meter face 19 be displayed in Code 39 as well.

One of the problems arising with the present invention is the change rate of the final digit in the string. As with human readable alphanumeric characters, when recording on-going data, such as energy consumed or, more familiarly, the mileage on one's car, the final digit, be it a units representation or less-than-zero representations, will change more rapidly than the remainder of the digits which appear, at a single glance, not to change at all. Accordingly, at any given time during a meter reading function, the final, units digit will likely be undergoing a change from the previous digit to the next sequential digit.

Code 39 offers no ordered progression of bars and spaces as digits increase from 0 through 9. The order of elements changes in a seemingly random pattern as the digits increase. It is therefore contemplated that the scanner will detect either the leading digit or the trailing digit since the gap between successive digits is virtually nonexistent. Initially, it should be noted that the difference between one unit and the next is in reality too small to be of significance. Therefore, it should not matter whether the scanner detects the leading digit or the trailing digit. However, should this present a problem with specific applications, it is contemplated that the scanner be programmed to scan the code several times, recording each reading and averaging the readings. Further, the meter reader could merely wait until a majority of the trailing digit was displayed and then conduct the scan. In any event, it is doubtful whether the change rate of the final digit will present a significant problem in most applications.

Figure 2:
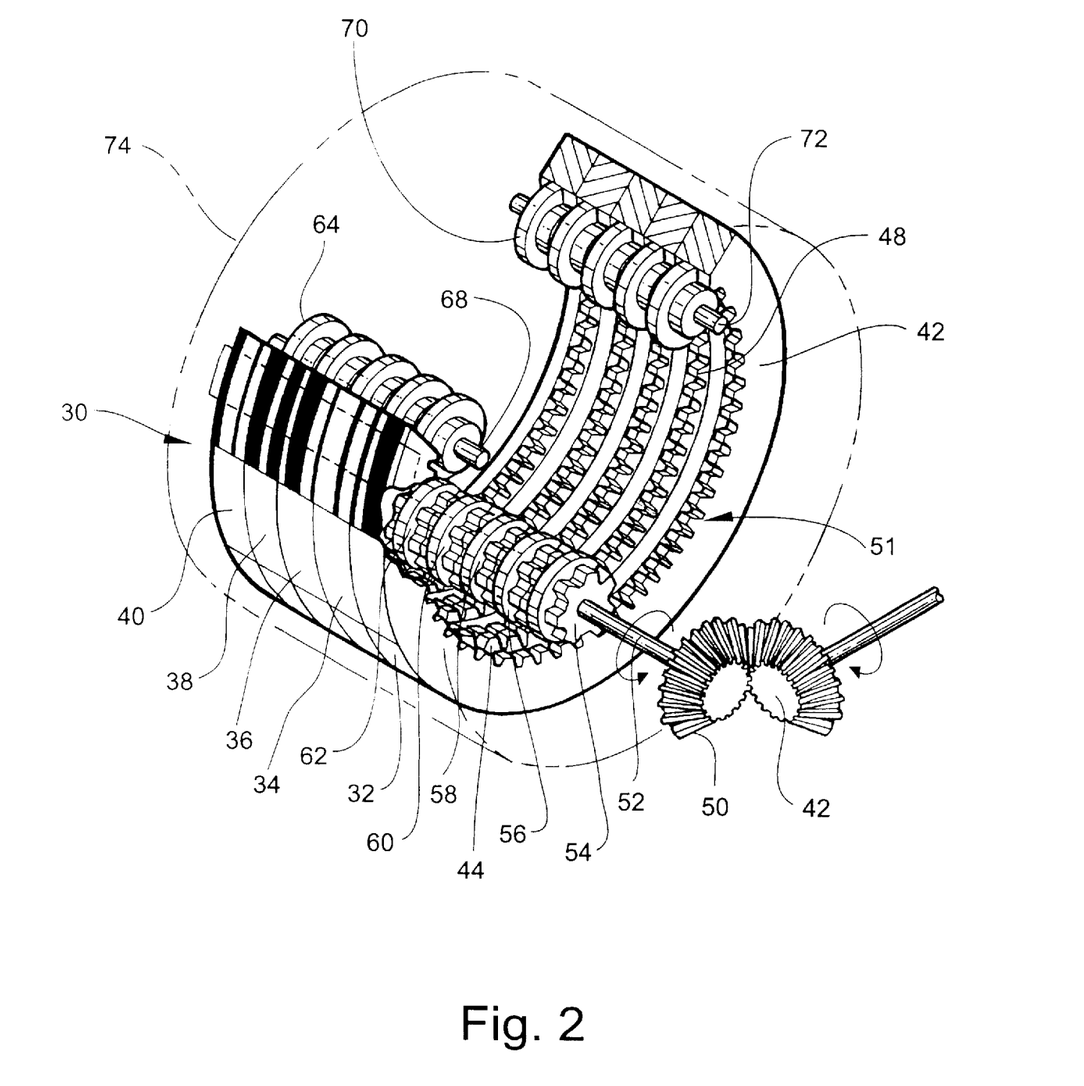
FIG. 2 is a perspective view of a portion of the changing assembly of the present invention, broken open for clarity.

Turning now to FIG. 2, the changing mechanism is illustrated. The bar code symbols are fixed in a uniform size, in sequential order, 0 through 9, circumferentially about the outer surface of a cylindrical tumbler 32,34,36,38,40, with a plurality of cylindrical tumblers 30 axially aligned and rotatable relative to one another so that, at any given position, the array of tumblers will present a linearly sequenced alphanumeric character set for scanning. As seen in FIG. 1, the code intended for scanning is defined by a generally rectangular window 26 formed in the face plate of the rate meter 12 to define the characters to be scanned.

Returning now to FIG. 2, the tumbler drive mechanism is illustrated. FIG. 2 is intended to be representative of a typical application and is not intended to provide accurate representations of Code 39. The tumblers 30 are illustrated at somewhat less than normal size for clarity. The tumbler operational mechanism is conventional and operates similarly to other gear driven counters.

Figure 3:
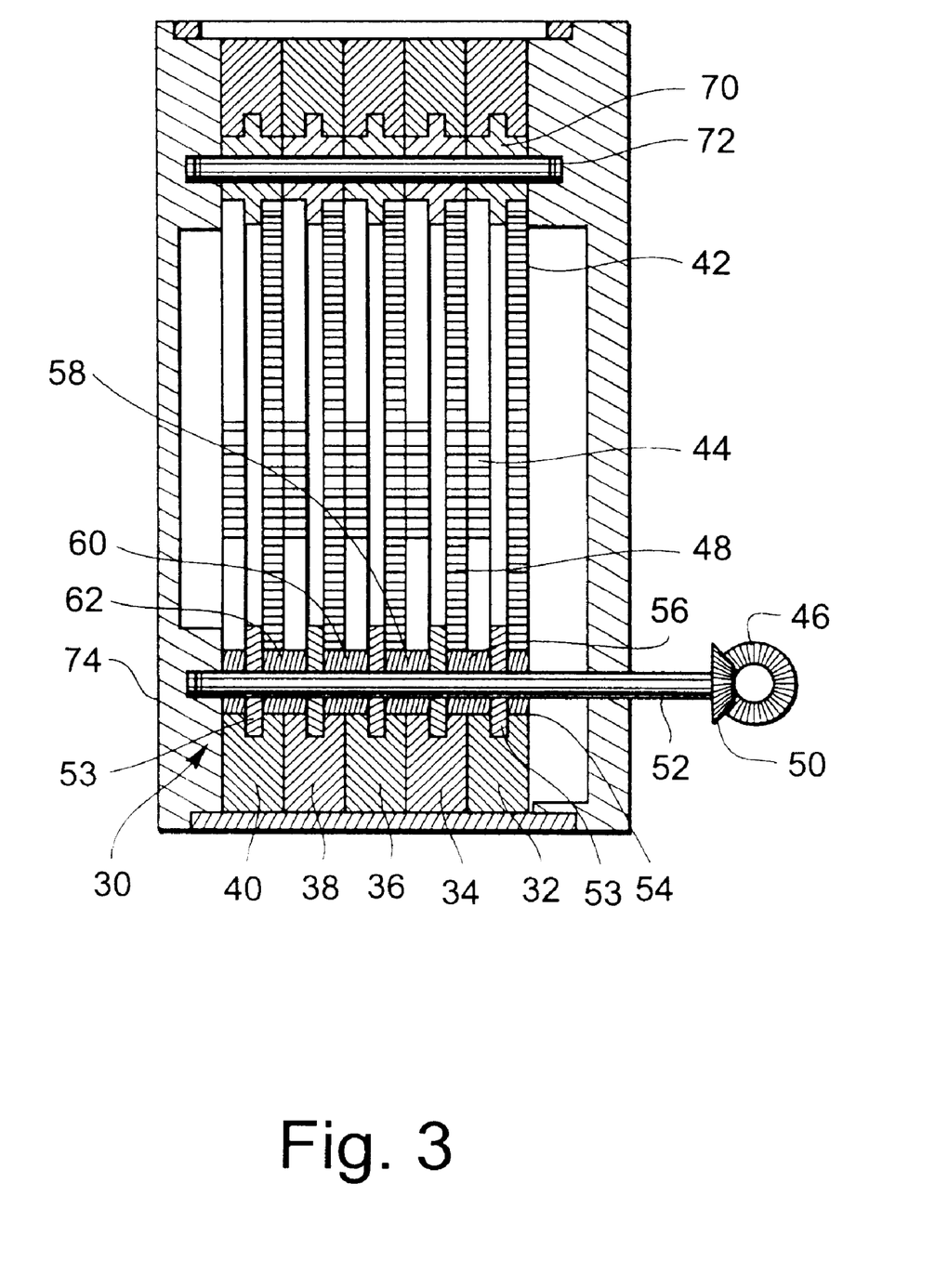
FIG. 3 is a cross-sectional view of the changing assembly illustrated in FIG. 2.

The tumblers 30 and drive mechanism are mounted in a housing 74, as best seen in FIGS. 2 and 3. Two sets of gear teeth are arranged around each interior surface of the tumblers 30. Looking first at the units tumbler 32, and at FIGS.

2 and 3, a first set of teeth 42 includes, preferably, sixty teeth and extends the full circumference of the tumbler. A second set of, preferably, six teeth 44 extends along a partial segment of the internal surface of the units tumbler 32 adjacent the first set of teeth 42. Adjacent these six teeth 44, the tens tumbler 34 is mounted and includes a circumferential arrangement of sixty teeth 48, similar to that of the units tumbler 32. This structure is duplicated on the hundreds tumbler 36, the thousands tumbler 38, and the ten thousands tumbler 40. The internal teeth are driven by a set of gears 51 which are rotatably mounted in linear alignment along an axle 52 projecting outwardly from the tumblers 30, with the first gear 54 fixed to the axle 52 for being rotatably driven thereby. The gears 51 are separated by a plurality of washers 53 disposed therebetween. The axle is terminated in a bevel gear 50 which is driven by a primary drive gear 46 which is also a bevel gear and is driven by the input to the meter. Each tumbler 30 has a drive gear associated therewith. Operation of the gear train will be described in greater detail presently.

Figure 4:
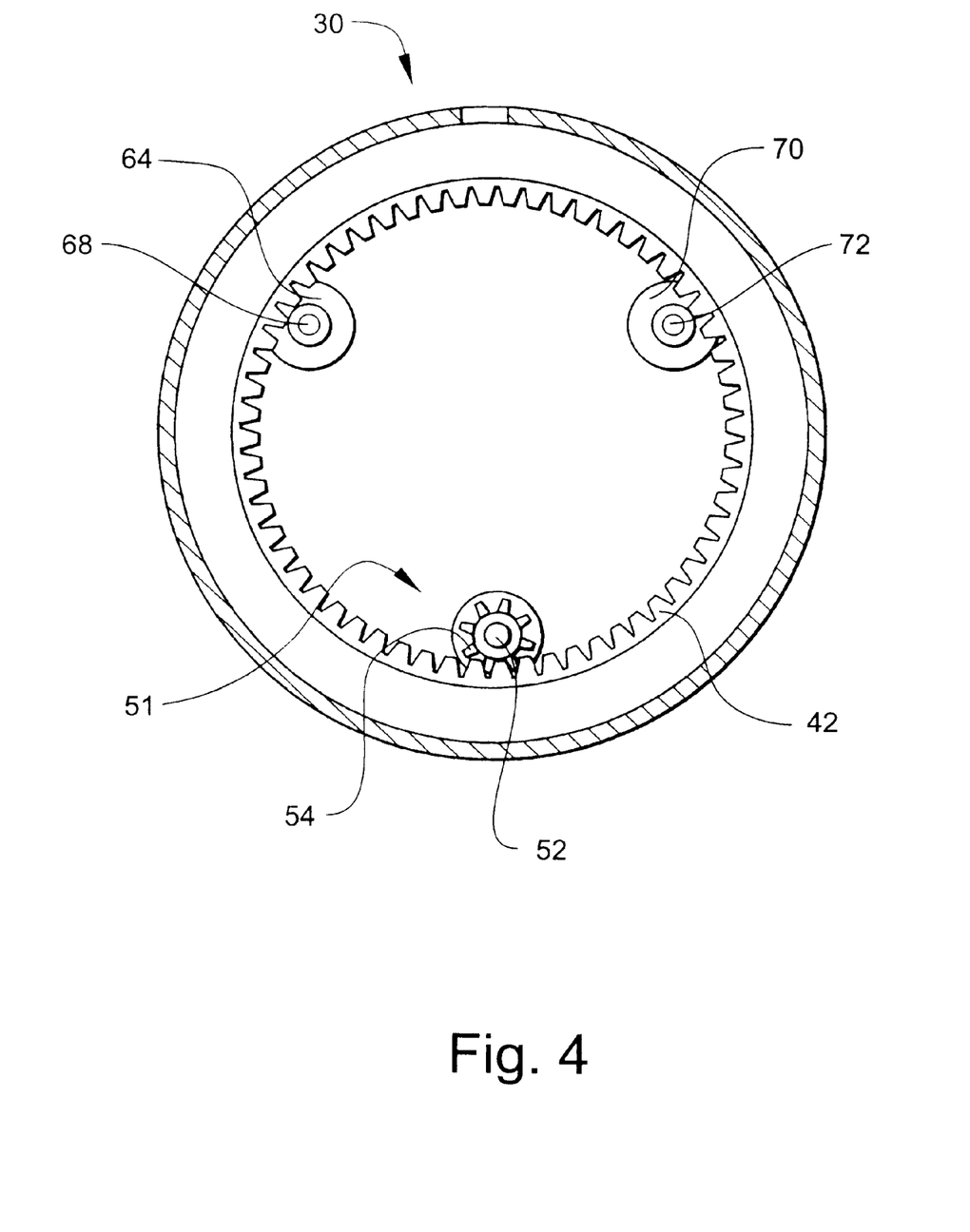
FIG. 4 is a side view of the changing assembly illustrated in FIG. 2.

A plurality of support washers 64 are mounted to an axle 68 and positioned approximately 120° away from the drive gears 51. A second set of support washers 70 is mounted to a second axle 72 and is positioned approximately 120° away from the first set of support washers 64 and the drive gears 51. This relationship is best seen in FIG. 4. Operation of the tumbler drive will be explained in greater detail presently.

Figure 5:
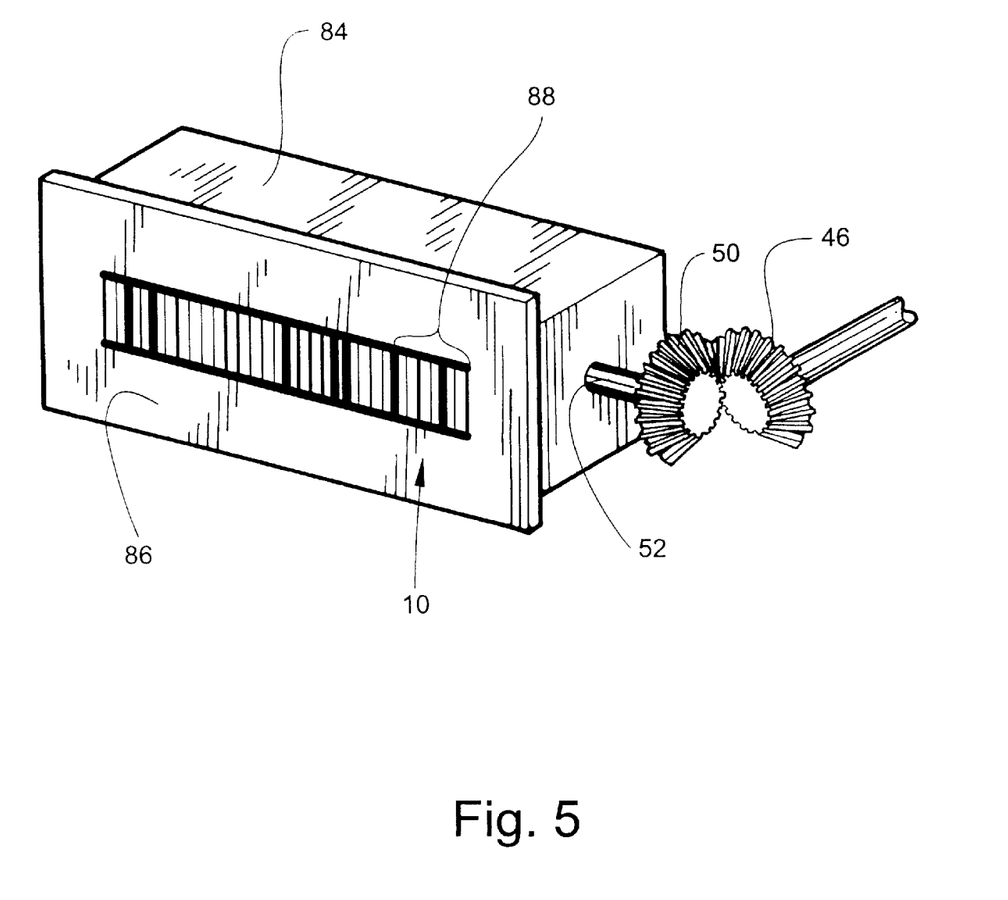
FIG. 5 is a perspective view of a self-contained display unit according to another preferred embodiment of the present invention.

According to a second preferred embodiment of the present invention, the display unit 10 may be provided with an enclosed housing 84 for retrofitting to existing rate meters. It should be understood that, due to the variety of meters available, it is not possible to illustrate every possible housing structural requirement capable of use with the present invention. Therefore, FIG. 5 illustrates a generalized housing 84. It should be well within the capability of one skilled in the art to formulate the necessary housing for matching with each existing type of meter.

As can be seen in FIG. 5, the generally rectangular housing 84 includes a face plate 86 through which the display 10 of data may be viewed. FIG. 5 also illustrates the preferred Code 39 with a representative digit 88 being indicated. The representative digit 88 is "0". An axle 52 projects outwardly from one side of the housing 84 and includes a bevel gear 50 attached thereto for mating with a beveled drive gear 46 for driving the tumblers within the housing 86.

Figure 6:
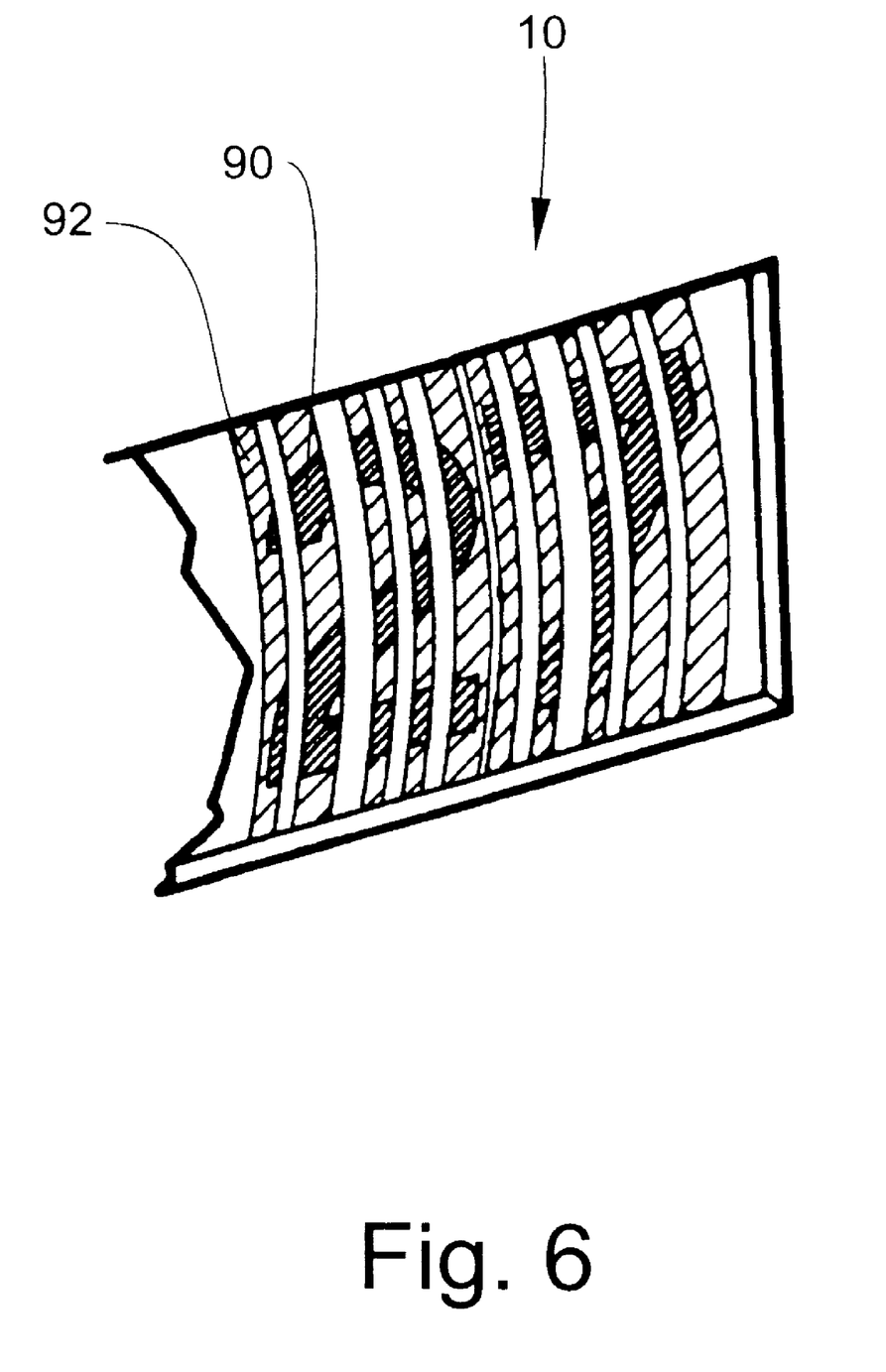
FIG. 6 is a perspective view of a portion of the machine readable code display illustrating the superposition of human readable indicia and machine readable indicia.

With reference to FIG. 6, in order to provide a secondary method for reading a meter, it has been determined that human readable alphanumeric characters 90 may be superimposed with bar code data 92. In order not to interfere with reflectivity of the white spaces associated with the bar code data 92, the human readable numerals 90 must be displayed on the dark portions of the bar code in a contrasting shade, sufficient to provide human readability while the dark portions of the bar code remain sufficiently dark to maintain machine readability. Further, color may be employed to provide the necessary contrast to form the structure of each numeral in a manner sufficiently clear to enable a human to read the numerals over the dark portions of the bar code data. The superposition of numerals and bar code data should relieve the anxiety some people associate with relying on machinery and computers to record data in a form not readable instantly by humans. It should be noted that Code 39 is not difficult to interpret if the encodation patterns are known. As seen in FIG. 5, the bar pattern of representative digit 88 is unique to the digit "0" and includes, from left to right, a narrow bar, a narrow space, a narrow bar, a wide space, a wide bar, a narrow space, a wide bar, a narrow space, and a narrow bar. However, such human interpretation of bar codes is time consuming and is beyond the capabilities of some people. Nevertheless, the superposition of bar code data and human readable numerals illustrated in FIG. 6 provides a secondary mode of data recovery in case the scanner becomes inoperable during meter reading operations.

Figure 7:
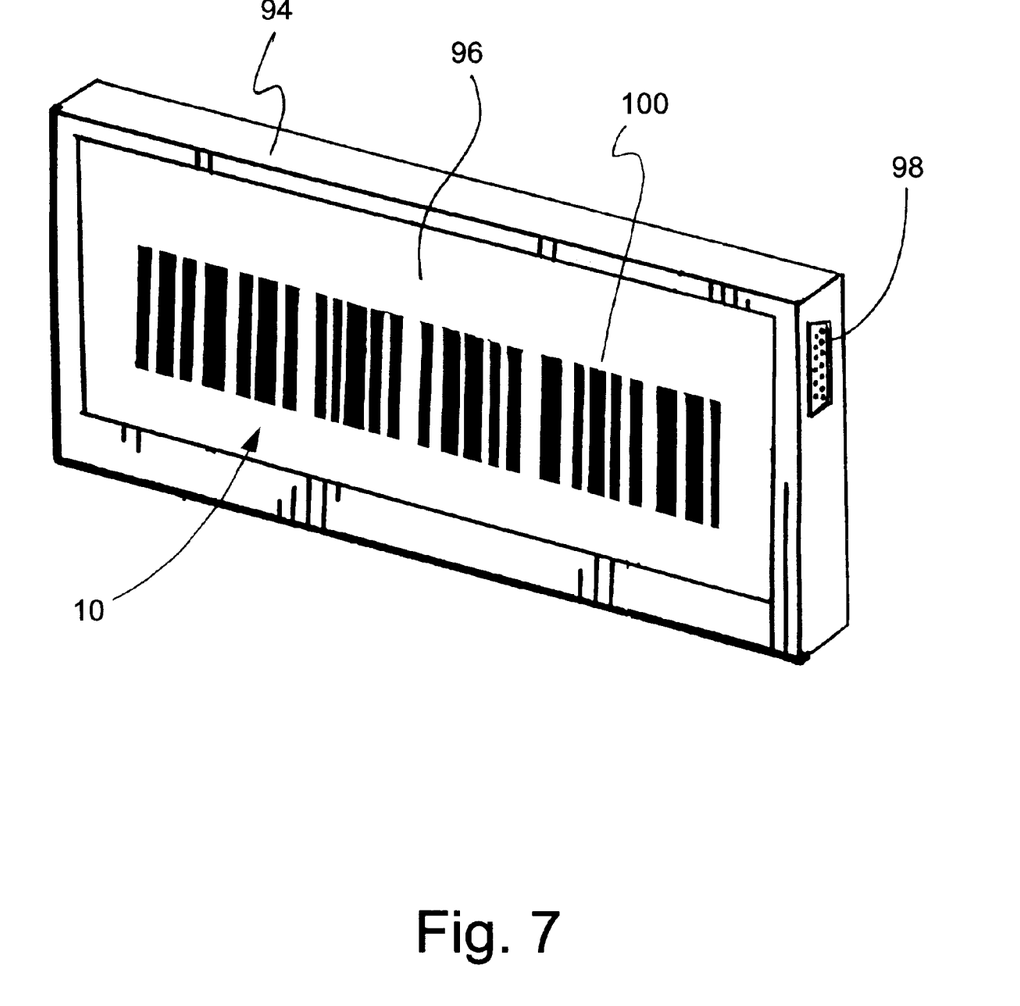
FIG. 7 is a perspective view of a self-contained electronic display unit according to another preferred embodiment of the present invention.

Turning now to FIG. 7, an electronic arrangement is provided for the display unit 10. FIG. 7 illustrates the electronic display in a self-contained housing, but it should be understood that the electronic display need not include its own housing and may be provided as an original feature on rate meters, as is known. The display unit 10 illustrated in FIG. 7 includes a housing 94 containing a lighted crystal diode (LCD) 96 for displaying bar code data 100. An input jack 98 is provided for inputting signals to the LCD display 96. It should be noted that an explanation of preprogramming the LCD 96 to display bar code is well within the skill of those versed in electronics and, since, the electronics required to display bar code on a lighted crystal diode is outside the scope of this invention, the circuitry and programming techniques will not be addressed herein. The display unit 10 illustrated in FIG. 7 may be retrofitted to an existing meter with the necessary input signal being applied to the input jack 98.

In operation, and with reference to FIGS. 2 and 3, power to the electric meter drives the primary drive gear 42 which is intermeshed with the bevel gear 50, both of which rotate in directions shown by arrows in FIG. 2. As the bevel gear 50 rotates, the units tumbler drive gear 54 attached thereto drives the units tumbler 32 using the sixty tooth gear portion 42. A complete revolution of the units tumbler 32 presents sequential Code 39 presentation of the digits 0 through 9. As the Code 39 representation for the digit 9 passes the display window, the six tooth portion 44 of the drive gear engages teeth on the tens tumbler drive gear 56 which causes rotation of that gear which is also intermeshed with the sixty tooth portion 48 of the tens digit tumbler 34. This interaction causes partial rotation of the tens digit tumbler 34 and, through the display window, the code 39 display on the tens digit tumbler 34 is advanced one position. This operation is repeated for the hundreds digit tumbler 36, the thousands digit tumbler 38, and the ten thousands digit tumbler 40 so that as each successive tumbler passes from 9 to 0, as viewed through the display window, the next successive tumbler is advanced one unit. As previously stated, this is a conventional drive.

As seen in FIG. 1, when meter reading is required, the meter reader aims the bar code scanner 25 at the display and obtains a reading, which is recorded for further processing. Optionally, the identification code 22 may be read to identify the customer. Further, if the meter is so equipped, the superimposed, human readable data may be manually recorded. The meter reading function is thus automated.

By the above, the present invention provides a machine readable display unit which is capable of adaptation to electric rate meters, gas rate meters, water rate meters and other registers for presenting accumulated data as an on-going, changeable numerical set. Accordingly, human error when reading electric rate meters is minimized and greater accuracy and less worker strain are obtained. Further, the unit is retrofittable to existing meters. Finally, by the superposition of bar code data and human readable numerals, a secondary source of the data is provided.

It will therefore be readily understood by those persons skilled in the art that the present invention is susceptible of a broad utility and application. Many embodiments and adaptations of the present invention other than those herein described, as well as many variations, modifications and equivalent arrangements will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

I claim:

1. A machine readable display unit for metered devices of the type displaying a changeable, readable indicia proportional to an input thereto, said input varying in relative value over a period of time, said machine readable display unit comprising:

means for displaying alpha-numeric indicia in a machine readable format; and means for changing said readable indicia responsive to the input to the metered device;

wherein said displaying means includes means for displaying said alphanumeric indicia as human readable indicia and a machine readable indicia.

2. A machine readable display unit according to claim 1 wherein said displaying means includes means for displaying alphanumeric indicia in a bar code format.

3. A machine readable display unit according to claim 2 wherein said readable indicia is readable and recordable by a bar code reading and recording device.

4. A machine readable display unit according to claim 3 wherein said displaying means includes means for displaying individual alphanumeric characters in a bar code format and said changing means includes means for changing said alphanumeric characters responsive to input to the metered device.

5. A machine readable display unit according to claim 4 wherein said display means includes a plurality of rotatably driven tumblers in axial alignment, said rotatable tumblers carrying said individual characters sequentially about an outer surface thereof for sequentially displaying said individual characters and said changing means includes means for rotatably driving said tumblers at a rate proportional to the input to the metered device.

6. A machine readable display unit according to claim 4 wherein said display means includes electronic means for displaying said characters in a machine readable format.

7. A machine readable display unit according to claim 6 wherein said electronic displaying means for displaying said characters includes a liquid crystal diode.

8. A machine readable display unit according to claim 1 wherein said human readable indicia is superimposed over said machine readable indicia.

9. A machine readable display unit according to claim 8 wherein said machine readable indicia is formed as a machine readable code including dark portions and light portions arranged in a predetermined pattern and said human readable indicia is formed with said dark portions in a contrasting shade sufficient to display said indicia in a human readable form with said dark portions remaining machine readable.

10. A machine readable display unit according to claim 1 wherein said display means is associated with an electric utility rate meter.

11. A machine readable display unit according to claim 1 wherein said display unit includes means for mounting and operating said display unit in a preexisting metered device for an alphanumeric display within the preexisting metered device.

12. A machine readable display unit according to claim 1 wherein said display unit includes a housing and input means for applying an input to said changing means proportional to the input to the metered device.

13. In combination, a utility rate meter of the type presenting a changeable readable indicia representative of energy consumed, said changeable readable indicia being changeable responsive to input to said rate meter, and a display unit connected to said rate meter, said display unit comprising means for displaying alphanumeric indicia in a machine readable format and means for changing said alphanumeric indicia responsive to input to the rate meter, wherein said displaying means includes means for displaying said alphanumeric indicia as human readable indicia and machine readable indicia.

14. The combination according to claim 13 wherein said means for displaying alphanumeric indicia includes means for displaying alphanumeric indicia in a bar code format.

15. The combination according to claim 14 wherein said readable indicia is readable by a bar code reading and recording device.

16. The combination according to claim 15 wherein said means for displaying alphanumeric indicia includes means for displaying individual alphanumeric characters in a bar code format and said changing means includes means for changing said individual alphanumeric characters responsive to input to the metered device.

17. A machine readable display unit according to claim 16 wherein said display means includes electronic means for displaying said characters.

18. A machine readable display unit according to claim 17 wherein said electronic means for displaying said characters includes a liquid crystal diode.

19. The combination according to claim 15 wherein said display means includes a plurality of rotatably driven tumblers in axial alignment, said rotatable tumblers carrying said individual characters sequentially about an outer surface thereof for sequentially displaying said individual characters and said changing means includes means for rotatably driving said tumblers at a rate proportional to the input to the metered device.

20. A machine readable display unit according to claim 13 wherein said human readable indicia is superimposed over said machine readable indicia.

21. A machine readable display unit according to claim 20 wherein said machine readable indicia is formed as a machine readable code including dark portions and light portions arranged in a predetermined pattern and said human readable indicia is formed with said dark portions in a contrasting shade sufficient to display said indicia in a human readable form with said dark portions remaining machine readable.

22. A machine readable display unit for metered devices of the type displaying a changeable, readable indicia proportional to an input thereto, said input varying in relative value over a period of time, said machine readable display unit comprising:

means for displaying alpha-numeric indicia in a machine readable format; and means for changing said readable indicia responsive to the input to the metered device;

wherein said displaying means includes electronic means for displaying individual alphanumeric characters in a machine readable bar code format and said changing means includes means for changing said alphanumeric characters responsive to input to the metered device.

23. A machine readable display unit according to claim 22 wherein said electronic means for displaying said characters includes a liquid crystal diode.

24. In combination, a utility rate meter of the type presenting a changeable readable indicia representative of energy consumed, said changeable readable indicia being changeable responsive to input to said rate meter, and a display unit connected to said rate meter, said display unit comprising means for displaying alphanumeric indicia in a machine readable format and means for changing said alphanumeric indicia responsive to input to the rate meter, said displaying means including electronic means for displaying individual alphanumeric characters in a bar code format and said changing means including means for changing each individual character responsive to input to the metered device.

25. A machine readable display unit according to claim 24 wherein said electronic means for displaying said characters includes a liquid crystal diode.

* * * * *